(12) United States Patent
Yamada

(10) Patent No.: US 11,688,834 B2
(45) Date of Patent: Jun. 27, 2023

(54) WAVELENGTH CONVERSION MEMBER AND LIGHT-EMITTING DEVICE FOR EFFICIENT WAVELENGTH CONVERSION

(71) Applicant: SEIKO EPSON CORPORATION, Tokyo (JP)

(72) Inventor: Yohei Yamada, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 17/805,941

(22) Filed: Jun. 8, 2022

(65) Prior Publication Data

US 2022/0399481 A1  Dec. 15, 2022

(51) Int. Cl.
*H01L 33/50* (2010.01)
*H01L 33/64* (2010.01)

(52) U.S. Cl.
CPC .......... *H01L 33/502* (2013.01); *H01L 33/641* (2013.01)

(58) Field of Classification Search
CPC ... H01L 33/502; H01L 33/641; H01L 23/142; H01J 37/32715; C22C 19/03; B22F 3/11
See application file for complete search history.

(56) References Cited

U.S. PATENT DOCUMENTS

| | | | |
|---|---|---|---|
| 2012/0138990 A1* | 6/2012 | Sato | H01L 33/641 257/E33.068 |
| 2017/0204518 A1 | 7/2017 | Yamasaki et al. | |
| 2017/0333992 A1* | 11/2017 | Gao | B22F 3/1017 |
| 2019/0199052 A1 | 6/2019 | Miyoshi et al. | |
| 2020/0194710 A1* | 6/2020 | Zhao | H01L 51/5253 |
| 2021/0359489 A1 | 11/2021 | Miyoshi et al. | |
| 2021/0384378 A1* | 12/2021 | Ikeda | H01L 33/20 |
| 2022/0246451 A1* | 8/2022 | Takebayashi | H01L 21/68785 |

FOREIGN PATENT DOCUMENTS

| | | |
|---|---|---|
| JP | 2011054759 A | 3/2011 |
| JP | 2017128796 A | 7/2017 |
| JP | 2017223869 A | 12/2017 |
| WO | 2019131439 A1 | 7/2019 |

* cited by examiner

*Primary Examiner* — Tracie Y Green
(74) *Attorney, Agent, or Firm* — Chip Law Group

(57) ABSTRACT

A wavelength conversion member includes: a phosphor; a metal joining layer provided on a bottom surface and a side surface of the phosphor; a metal heat-dissipating holding unit including a recess that covers the bottom surface and at least a portion of the side surface of the phosphor and that accommodates the phosphor so that the phosphor is embedded in the recess; and a metal porous joining material provided between the metal joining layer and the metal heat-dissipating holding unit.

5 Claims, 4 Drawing Sheets

WAVELENGTH CONVERSION MEMBER AND LIGHT-EMITTING DEVICE FOR EFFICIENT WAVELENGTH CONVERSION

The present application is based on, and claims priority from JP Application Serial Number 2021-098575, filed Jun. 14, 2021, the disclosure of which is hereby incorporated by reference herein in its entirety.

BACKGROUND

1. Technical Field

The present disclosure relates to a wavelength conversion member and a light-emitting device.

2. Related Art

Wavelength conversion members that emit yellow light upon irradiation with a blue laser beam are used in projectors. The conversion efficiency of wavelength conversion members decreases as the temperature rises. The wavelength conversion member disclosed in JP-A-2017-223869 includes a heat-dissipating holding unit that dissipates heat as a metal heat-dissipating holding unit. The wavelength conversion member irradiated with a blue laser beam conducts heat to the heat-dissipating holding unit to suppress the temperature from rising.

A phosphor is a ceramic phosphor obtained by sintering a ceramic base prepared using yttrium aluminum garnet (YAG) powder. The material of the heat-dissipating holding unit is GaN or AlN.

Intermittent irradiation with a blue laser beam causes the temperature of the phosphor to change. In the wavelength conversion member of JP-A-2017-223869, there is a difference between the thermal expansion of the phosphor and the thermal expansion of the heat-dissipating holding unit, and thus a gap is created between the side surface of the phosphor and the heat-dissipating holding unit. Therefore, a clearance is formed between the side surface of the phosphor and the heat-dissipating holding unit, which makes it difficult to conduct heat. The bottom surface of the phosphor and the heat-dissipating holding unit are brought into contact with each other to conduct heat. Dissipating heat only from the bottom surface of the phosphor is insufficient to cool the phosphor, causes the temperature of the phosphor to rise, and decreases the wavelength conversion efficiency of the phosphor. Therefore, there is a desire for a wavelength conversion member that can dissipate heat not only from the bottom surface of the phosphor but also from the side surface thereof. Furthermore, since the phosphor and the heat-dissipating holding unit have different linear expansion coefficients, change in temperature causes the heat-dissipating holding unit and the phosphor to relatively expand or contract, causing cracking between the heat-dissipating holding unit and the bottom surface of the phosphor.

SUMMARY

A wavelength conversion member includes: a phosphor, a metal joining layer provided on a bottom surface and a side surface of the phosphor, a metal heat-dissipating holding unit including a recess that covers the bottom surface and at least a portion of the side surface of the phosphor and that accommodates the phosphor so that the phosphor is embedded in the recess, and a metal porous joining material provided between the metal joining layer and the metal heat-dissipating holding unit.

A light-emitting device includes the wavelength conversion member described above.

DESCRIPTION OF EXEMPLARY EMBODIMENTS

First Embodiment

In the present embodiment, a characteristic example of a projector and a wavelength conversion member used in this projector will be described with reference to drawings. The projector is a projection-type image display device that displays color video on a screen.

Figure 1:
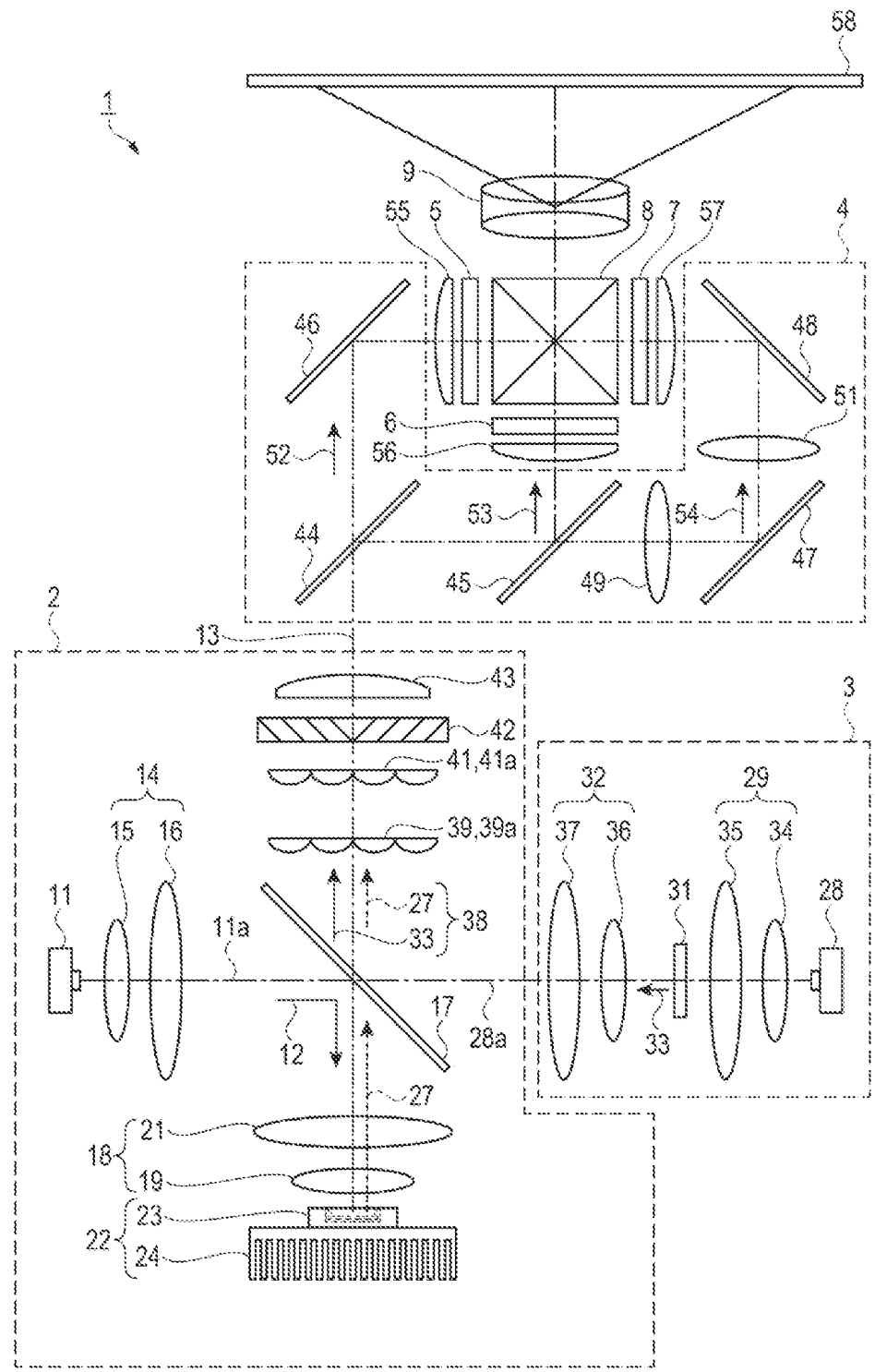
FIG. 1 is a configuration diagram illustrating an optical system of a projector according to a first embodiment.

FIG. 1 is a configuration diagram illustrating an optical system of a projector. As illustrated in FIG. 1, a projector 1 includes a first illumination device 2 as a light-emitting device, a second illumination device 3, a color-separating light-guiding optical system 4, a red light-modulating device 5, a green light-modulating device 6, a blue light-modulating device 7, a cross dichroic prism 8, and a projection optical device 9. The red light-modulating device 5, the green light-modulating device 6, and the blue light-modulating device 7 are light-modulating devices corresponding to the respective colored light of red light, green light, and blue light, respectively.

The first illumination device 2 includes a first light source 11, a collimating optical system 14, a first dichroic mirror 17, a focusing optical system 18, a wavelength conversion device 22, a first lens array 39, a second lens array 41, a polarization conversion element 42, and a superimposed lens 43.

The first light source 11 includes a semiconductor laser. The first light source 11 emits first blue light 12. The first blue light 12 is a laser beam of blue light. The wavelength of the peak of the light emission intensity indicating the wavelength of the first blue light 12 is about 445 nm. Note that the wavelength of the first blue light 12 is not limited to 445 nm, and may be 460 nm, for example.

The optical axis of the first light source 11 is referred to as the first optical axis 11a. The optical axis of the first blue light 12 emitted by the first illumination device 2 is referred to as the illumination optical axis 13. The first optical axis 11a is orthogonal to the illumination optical axis 13. The first blue light 12 emitted by the first light source 11 irradiates the collimating optical system 14. The collimating optical system 14 includes a first lens 15 and a second lens 16. The collimating optical system 14 substantially collimates the first blue light 12. The first lens 15 and the second lens 16 are convex lenses.

The first blue light 12 that passes through the collimating optical system 14 irradiates the first dichroic mirror 17. The first dichroic mirror 17 intersects the first optical axis 11a and the illumination optical axis 13 at an angle of 45°. The first dichroic mirror 17 reflects the first blue light 12, and allows yellow fluorescent light including red light and green light to pass through.

The first blue light 12 reflected by the first dichroic mirror 17 irradiates the focusing optical system 18. The focusing optical system 18 includes a third lens 19 and a fourth lens 21. The third lens 19 and the fourth lens 21 are convex lenses. The first blue light 12 passes through the focusing optical system 18 to irradiate the wavelength conversion device 22.

The wavelength conversion device 22 includes a wavelength conversion member 23 and a heat sink 24. The wavelength conversion member 23 is coupled to the heat sink 24. The heat sink 24 cools the wavelength conversion member 23.

The focusing optical system 18 focuses the first blue light 12 reflected by the first dichroic mirror 17 to irradiate the wavelength conversion member 23. The first blue light 12 is incident on the wavelength conversion device 22. The wavelength conversion member 23 converts the first blue light 12 into yellow light 27 and emits the same. The yellow light 27 emitted by the wavelength conversion member 23 irradiates the focusing optical system 18. The focusing optical system 18 substantially collimates the yellow light 27. As described above, the first illumination device 2 includes the first light source 11, the focusing optical system 18, and the wavelength conversion device 22.

The focusing optical system 18 and the first dichroic mirror 17 are disposed along the illumination optical axis 13. The yellow light 27 passes through the focusing optical system 18 and the first dichroic mirror 17.

The second illumination device 3 is disposed on the right side of the first illumination device 2 in the figure. The second illumination device 3 includes a second light source 28, a focusing optical system 29, a scatter sheet 31, and a collimating optical system 32.

The second light source 28 includes the same semiconductor laser as that of the first light source 11. The second light source 28 emits second blue light 33. The optical axis of the second light source 28 is referred to as the second optical axis 28a. The second blue light 33 passes through the focusing optical system 29, the scatter sheet 31, and the collimating optical system 32 in this order along the second optical axis 28a. The focusing optical system 29 causes the second blue light 33 to be focused near the scatter sheet 31. The focusing optical system 29 includes a fifth lens 34 and a sixth lens 35. The fifth lens 34 and the sixth lens 35 are convex lenses.

The scatter sheet 31 scatters the second blue light 33. The scatter sheet 31 causes the light distribution of the second blue light 33 to be similar to the light distribution of the yellow light 27 emitted from the wavelength conversion member 23. For the scatter sheet 31, frosted glass made from an optical glass is used, for example.

The collimating optical system 32 substantially collimates the light from the scatter sheet 31. The collimating optical system 32 includes a seventh lens 36 and an eighth lens 37. The seventh lens 36 and the eighth lens 37 each include a convex lens.

The second blue light 33 that passes through the collimating optical system 32 is reflected by the first dichroic mirror 17. The second blue light 33 and the yellow light 27 transmitted through the first dichroic mirror 17 are synthesized into white light 38.

The first lens array 39, the second lens array 41, the polarization conversion element 42, and the superimposed lens 43 are disposed in this order along the illumination optical axis 13. The white light 38 synthesized by the first dichroic mirror 17 passes through the first lens array 39, the second lens array 41, the polarization conversion element 42, and the superimposed lens 43 in this order.

The first lens array 39 divides the white light 38 into a plurality of partial light fluxes. The first lens array 39 includes a plurality of first lenslets 39a. The plurality of first lenslets 39a are arranged in a matrix in a plane orthogonal to the illumination optical axis 13.

The second lens array 41 and the superimposed lens 43 cause the images formed by the respective first lenslets 39a of the first lens array 39 to be formed in the vicinity of the image-forming regions of the red light-modulating device 5, the green light-modulating device 6, and the blue light-modulating device 7. The second lens array 41 includes a plurality of second lenslets 41a. The plurality of second lenslets 41a are arranged in a matrix in a plane orthogonal to the illumination optical axis 13. The plurality of second lenslets 41a are disposed corresponding to the plurality of first lenslets 39a.

The polarization conversion element 42 converts each of the partial light fluxes divided by the first lens array 39 into linearly polarized light. The polarization conversion element 42 includes a polarization separation layer, a reflection layer, and a retardation plate. Of the polarized components included in the yellow light 27 constituting the white light 38, the polarization separation layer transmits one linearly polarized component as is, and reflects the other linearly polarized component toward the reflection layer. The reflection layer reflects the other linearly polarized component reflected by the polarization separation layer in a direction parallel to the illumination optical axis 13. The retardation plate converts the other linearly polarized component reflected by the reflection layer into the one linearly polarized component.

The superimposed lens 43 focuses each of the partial light fluxes from the polarization conversion element 42 to cause them to be superimposed one upon another in the vicinity of the image-forming regions of the red light-modulating device 5, the green light-modulating device 6, and the blue light-modulating device 7. The first lens array 39, the second lens array 41, and the superimposed lens 43 constitute an integrator optical system that makes the in-plane light intensity distribution of the yellow light 27 constituting the white light 38 uniform. The white light 38 that passed through the superimposed lens 43 is input to the color-separating light-guiding optical system 4.

The color-separating light-guiding optical system 4 includes a second dichroic mirror 44, a third dichroic mirror 45, a first reflection mirror 46, a second reflection mirror 47, a third reflection mirror 48, a first relay lens 49, and a second relay lens 51. The color-separating light-guiding optical system 4 separates the white light 38 that passed through the superimposed lens 43 into red light 52, green light 53, and third blue light 54. The color-separating light-guiding optical system 4 guides the red light 52 to the red light-modulating device 5, the green light 53 to the green light-modulating device 6, and the third blue light 54 to the blue light-modulating device 7, respectively.

A first field lens 55 is disposed between the color-separating light-guiding optical system 4 and the red light-modulating device 5. A second field lens 56 is disposed between the color-separating light-guiding optical system 4 and the green light-modulating device 6. A third field lens 57 is disposed between the color-separating light-guiding optical system 4 and the blue light-modulating device 7.

The second dichroic mirror 44 is a dichroic mirror that causes the red light 52 to pass through and reflects the green light 53 and the third blue light 54. The third dichroic mirror 45 is a dichroic mirror that reflects the green light 53 and causes the third blue light 54 to pass through. The first reflection mirror 46 is a reflection mirror that reflects the red light 52. The second reflection mirror 47 and the third reflection mirror 48 are reflection mirrors that reflect the third blue light 54.

The red light 52 that passed through the second dichroic mirror 44 is reflected by the first reflection mirror 46, passes through the first field lens 55, and is incident on the image-forming region of the red light-modulating device 5 for the red light 52.

The green light 53 reflected by the second dichroic mirror 44 is further reflected by the third dichroic mirror 45, passes through the second field lens 56, and is incident on the image-forming region of the green light-modulating device 6 for the green light 53.

The third blue light 54 reflected by the second dichroic mirror 44 passes through the third dichroic mirror 45. The third blue light 54 that passed through the third dichroic mirror 45 goes through the first relay lens 49, the second reflection mirror 47, the second relay lens 51, the third reflection mirror 48 on the emission side, and the third field lens 57 before being incident on the image-forming region of the blue light-modulating device 7 for the third blue light 54.

The red light-modulating device 5, the green light-modulating device 6, and the blue light-modulating device 7 modulate the respective incident colored light in accordance with image information to form imaging light corresponding to the respective colored light. The red light-modulating device 5 modulates the red light 52, of which the wavelength was converted by the wavelength conversion device 22 and which is included in the yellow light 27, in accordance with image information to form imaging light. The green light-modulating device 6 modulates the green light 53, of which the wavelength was converted by the wavelength conversion device 22 and which is included in the yellow light 27, in accordance with image information to form imaging light. The blue light-modulating device 7 modulates the third blue light 54 corresponding to the second blue light 33 emitted from the second light source 28 in accordance with image information to form imaging light.

Note that although not illustrated, an incident-side polarizing plate is disposed between the first field lens 55 and the red light-modulating device 5. An emission-side polarizing plate is disposed between the red light-modulating device 5 and the cross dichroic prism 8. Similarly, an incident-side polarizing plate is disposed between the second field lens 56 and the green light-modulating device 6. An emission-side polarizing plate is disposed between the green light-modulating device 6 and the cross dichroic prism 8. An incident-side polarizing plate is disposed between the third field lens 57 and the blue light-modulating device 7. An emission-side polarizing plate is disposed between the blue light-modulating device 7 and the cross dichroic prism 8.

The cross dichroic prism 8 is an optical element that synthesizes each imaging light emitted from the red light-modulating device 5, the green light-modulating device 6, and the blue light-modulating device 7 to form color imaging light. The cross dichroic prism 8 has a substantially square shape obtained by bonding together four right-angle prisms in plan view. A dielectric multilayer film is formed at substantially X-shaped interfaces at which the right-angle prisms are bonded together.

Red imaging light travels from the red light-modulating device 5 to the cross dichroic prism 8. Green imaging light travels from the green light-modulating device 6 to the cross dichroic prism 8. Blue imaging light travels from the blue light-modulating device 7 to the cross dichroic prism 8. The imaging light of each color is synthesized into color imaging light by the cross dichroic prism 8.

The color imaging light emitted from the cross dichroic prism 8 is enlarged and projected onto the screen 58. A color image is formed on the screen 58.

As described above, the projector 1 includes the first illumination device 2, the second illumination device 3, the color-separating light-guiding optical system 4, the red light-modulating device 5, the green light-modulating device 6, the blue light-modulating device 7, and the projection optical device 9.

Figure 2:
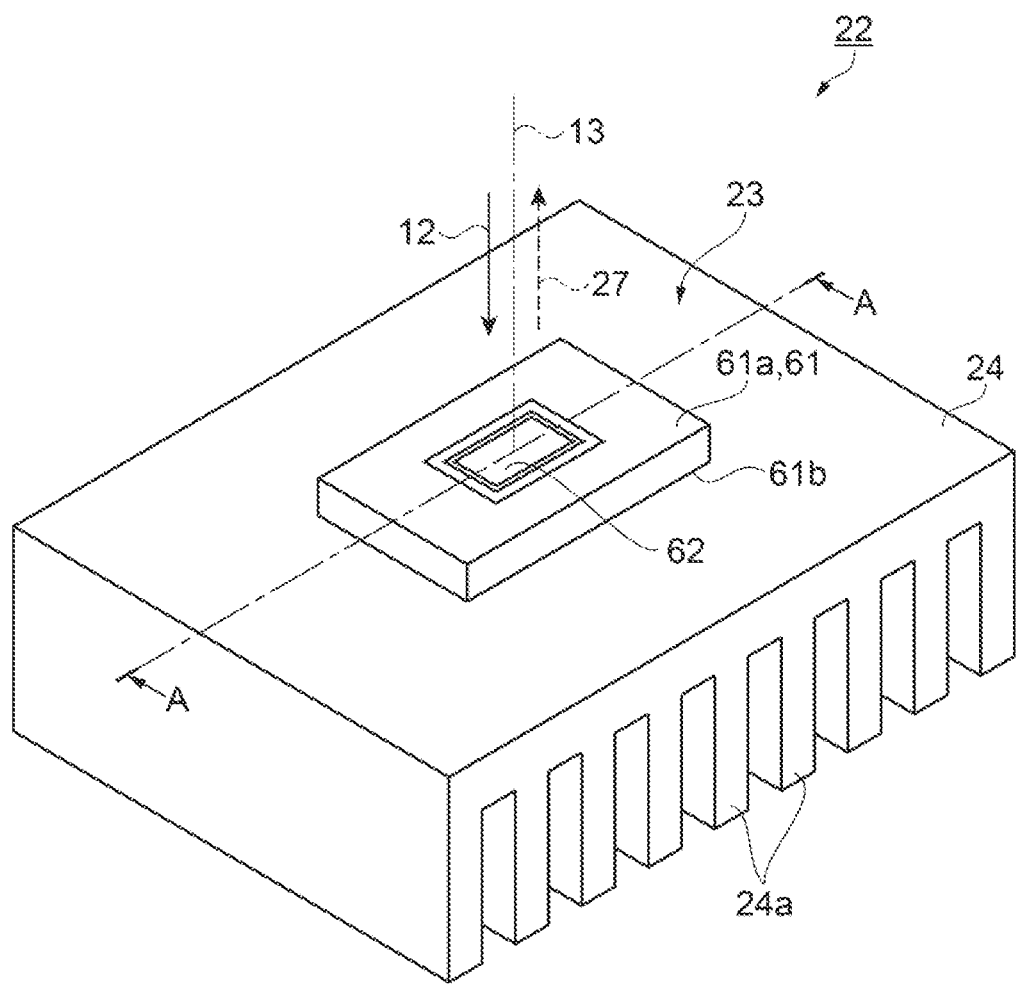
FIG. 2 is a schematic perspective view illustrating a configuration of a wavelength conversion device.

As illustrated in FIG. 2, a plurality of plate-shaped fins 24a are disposed in the heat sink 24 of the wavelength conversion device 22. The wavelength conversion member 23 includes a metal heat-dissipating holding unit 61. The metal heat-dissipating holding unit 61 is a plate having a rectangular planar shape. The heat sink 24-side surface of the metal heat-dissipating holding unit 61 is the back surface 61b, and the side opposite to the back surface 61b is the front surface 61a. The back surface 61b is in close contact with the heat sink 24, which allows the heat of the metal heat-dissipating holding unit 61 to be easily conducted to the heat sink 24. The material of the metal heat-dissipating holding unit 61 and that of the heat sink 24 are not particularly limited as long as they have good thermal conductivity. In the present embodiment, for example, copper or a copper alloy is used for the metal heat-dissipating holding unit 61. Aluminum is used for the heat sink 24.

The wavelength conversion member 23 includes a phosphor 62 in the center of the front surface 61a of the metal heat-dissipating holding unit 61. The phosphor 62 is excited by the first blue light 12 to emit the yellow light 27 having a second wavelength band. The surface at which the first blue light 12 is incident on the phosphor 62 is also an emission surface from which the yellow light 27 is emitted. The yellow light 27 is yellow light including red light and green light. The phosphor 62 contains, for example, $(Y,Gd)_3(Al,Ga)_5O_{12}$:Ce that is a YAG-based phosphor.

Figure 3:
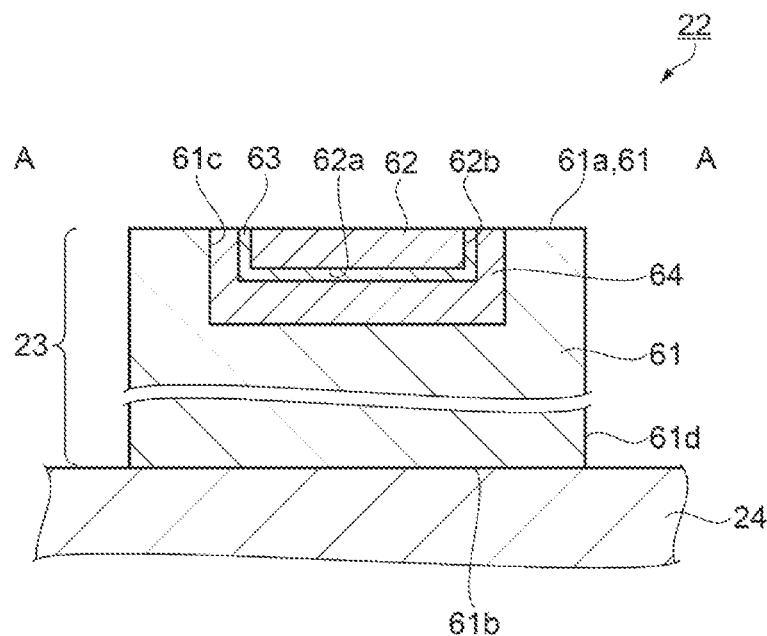
FIG. 3 is a schematic side cross-sectional view of a wavelength conversion device.

FIG. 3 is a cross-sectional view taken along the line A-A in FIG. 2. As illustrated in FIG. 3, the metal heat-dissipating holding unit 61 includes a recess 61c. The recess 61c covers the bottom surface 62a and at least a portion of the side surface 62b of the phosphor 62, and accommodates the phosphor 62 so that the phosphor 62 is embedded in the recess. As illustrated in the figure, the entire side surface 62b of the phosphors 62 may be embedded in the recess 61c. A portion of the side surface 62b of the phosphor 62 may be embedded in the recess 61c.

A metal joining layer 63 is provided on the bottom surface 62a and the side surface 62b of the phosphor 62. A metal porous joining material 64 is provided between the metal joining layer 63 and the metal heat-dissipating holding unit 61. The metal joining layer 63 is provided to join the metal porous joining material 64 to the phosphor 62. The metal porous joining material 64 has a cellular structure. The cellular structure is also referred to as a porous structure.

Therefore, it is difficult to directly join the metal porous joining material 64 to the phosphor 62. Accordingly, when the metal porous joining material 64 is provided on the bottom surface 62a and the side surface 62b of the phosphor 62, the metal porous joining material 64 and the phosphor 62 can peel off from each other. It is not preferable to switch the positions of the metal joining layer 63 and the metal porous joining material 64.

The material of the metal joining layer 63 may be a material that is easily joined to the phosphor 62. It is only required that the material of the metal joining layer 63 and that of the metal porous joining material 64 have good thermal conductivity. In the present embodiment, for example, silver is used as a main raw material of the metal joining layer 63 and the metal porous joining material 64. The bond between the metal joining layer 63 and the metal porous joining material 64 is metallic bond.

When the phosphor 62 is irradiated with the first blue light 12, the phosphor 62 generates heat to become a heat source. The heat of the phosphor 62 is conducted from the bottom surface 62a and the side surface 62b of the phosphor 62 through the metal joining layer 63 and the metal porous joining material 64 to the recess 61c. The heat of the metal heat-dissipating holding unit 61 is conducted to the heat sink 24. The heat conducted to the heat sink 24 is air-cooled by the fins 24a.

According to this configuration, the metal porous joining material 64 having a cellular structure is provided between the metal heat-dissipating holding unit 61 and the metal joining layer 63 provided on the phosphor 62. The metal heat-dissipating holding unit 61 and the phosphor 62 have different linear expansion coefficients. Because the metal porous joining material 64 is easily deformed, it is possible to suppress cracking between the metal heat-dissipating holding unit 61 and the phosphor 62 even when change in temperature causes the metal heat-dissipating holding unit 61 and the phosphor 62 to relatively expand or contract.

The metal porous joining material 64 is disposed between the bottom surface 62a and the side surface 62b of the phosphor 62 and the metal heat-dissipating holding unit 61. The metal porous joining material 64 has good thermal conductivity. Accordingly, the heat of the phosphor 62 can be dissipated not only from the bottom surface 62a of the phosphor 62 but also from the side surface 62b thereof.

The metal joining layer 63 and the metal porous joining material 64 are metallically bonded. Accordingly, heat can be more efficiently conducted than when the metal joining layer 63 and the metal porous joining material 64 are adhered together by an adhesive such as resin. Furthermore, metallic bond offers a stronger bond than adhesion and fixing by an adhesive. Accordingly, the metal joining layer 63 and the metal porous joining material 64 can be suppressed from peeling off from each other.

In the wavelength conversion member 23, the entire side surface 62b of the phosphor 62 is covered with the metal porous joining material 64, and the entire side surface 62b of the phosphor 62 is embedded in the recess 61c of the metal heat-dissipating holding unit 61.

According to this configuration, the entire side surface 62b of the phosphor 62 is covered with the metal porous joining material 64. Accordingly, heat can be conducted from the entire side surface 62b of the phosphor 62 to the metal porous joining material 64. The entire side surface 62b of the phosphor 62 is embedded in the recess 61c of the metal heat-dissipating holding unit 61. Accordingly, it is possible to more efficiently conduct heat from the metal porous joining material 64 to the metal heat-dissipating holding unit 61 than when the side surface 62b of the phosphor 62 is not entirely embedded in the recess 61c of the metal heat-dissipating holding unit 61.

The linear expansion coefficient of the metal heat-dissipating holding unit 61 is $15 \times 10^{-6}/°$ C. to $18 \times 10^{-6}/°$ C. The linear expansion coefficient of the metal joining layer 63 is $14.7 \times 10^{-6}/°$ C. to $24.7 \times 10^{-6}/°$ C. According to this configuration, the difference between the linear expansion coefficient of the metal heat-dissipating holding unit 61 and the linear expansion coefficient of the metal joining layer 63 is small. Accordingly, even when a change in temperature occurs, stress between the metal heat-dissipating holding unit 61 and the metal joining layer 63 can be mitigated to suppress cracking.

The ratio of metal in unit volume of the metal porous joining material 64 is not less than 60% and not more than 70%. According to this configuration, the ratio of metal in unit volume of the metal porous joining material 64 is not less than 60%, and thus the metal porous joining material 64 can efficiently conduct heat. Furthermore, cracking of the metal porous joining material 64 due to insufficient strength can be suppressed. Since the ratio of metal in unit volume of the metal porous joining material 64 is not more than 70%, stress caused by the expansion difference between the phosphor 62 and the metal heat-dissipating holding unit 61 can be mitigated even when heat fluctuates.

The first illumination device 2 includes the wavelength conversion member 23. According to this configuration, the wavelength conversion member 23 included in the first illumination device 2 can dissipate heat not only from the bottom surface 62a of the phosphor 62 but also from the side surface 62b thereof. The wavelength conversion member 23 can efficiently convert wavelengths when maintained at low temperature. Accordingly, the first illumination device 2 can be a device including a wavelength conversion member 23 capable of efficiently converting wavelengths. The wavelength conversion member 23 can suppress cracking between the metal heat-dissipating holding unit 61 and the phosphor 62. Accordingly, the first illumination device 2 can be a device including a wavelength conversion member 23 having high long-term reliability.

The dimensions of each member are not particularly limited. In the present embodiment, for example, the thickness of the phosphor 62 is 30 μm to 80 μm. The thickness of the metal joining layer 63 is 0.1 μm to 0.4 μm. The thickness of the metal porous joining material 64 is 40 μm to 80 μm. The thickness of the metal heat-dissipating holding unit 61 is 2 mm to 5 mm.

Next, a method of manufacturing the wavelength conversion member 23 will be described. The metal joining layer 63 is formed on the bottom surface 62a and the side surface 62b of the phosphor 62. Silver is used as an evaporation material, and silver is deposited on the phosphor 62 to form the metal joining layer 63. A vacuum vapor deposition device is used for film formation of the metal joining layer 63. In addition, a sputtering device may be used for film formation of the metal joining layer 63.

The recess 61c is formed in the metal heat-dissipating holding unit 61. The recess 61c may be formed by machining such as milling. In addition, the recess 61c may be formed by electric discharge machining. Next, a mixture obtained by mixing together silver particles and a binder such as wax is applied to the recess 61c. Next, the phosphor 62 is disposed in the recess 61c. The mixture is sandwiched between the metal joining layer 63 of the phosphor 62 and the metal heat-dissipating holding unit 61.

The metal heat-dissipating holding unit 61 with the phosphor 62 disposed therein is heated in an oven. The binder is removed, and the silver particles are sintered. As a result, the metal porous joining material 64 is formed between the metal joining layer 63 and the metal heat-dissipating holding unit 61. The metal joining layer 63, the metal porous joining material 64, and the metal heat-dissipating holding unit 61 are bonded by metallic bond.

As one of the conventional examples, there is a method of impregnating a porous material formed by firing thermally conductive particles with thermosetting resin. The porous material of this conventional example corresponds to the metal porous joining material 64. Sandwiching the porous material impregnated with the resin between the phosphor 62 and the metal heat-dissipating holding unit 61 having no recess 61c and heating the same cures the resin. A structure in which the porous material is sandwiched between the phosphor 62 and the metal heat-dissipating holding unit 61 having no recess 61c is formed by this method. A metal reflection layer may be placed between the porous material and the phosphor 62. A metal reflection layer may be placed between the porous material and the metal heat-dissipating holding unit 61. However, the structure of the wavelength conversion member according to the conventional example is a structure different from that of the wavelength conversion member 23 according to the present disclosure in which the metal joining layer 63, the metal porous joining material 64, and the metal heat-dissipating holding unit 61 are metallically bonded. The thermosetting resin adheres together the porous material, the phosphor 62, and the metal heat-dissipating holding unit 61 having no recess 61c. Since it includes interposing resin, the structure of the conventional example has lower thermal conductivity and smaller bonding strength than metallic bond of the present embodiment.

Figure 6:
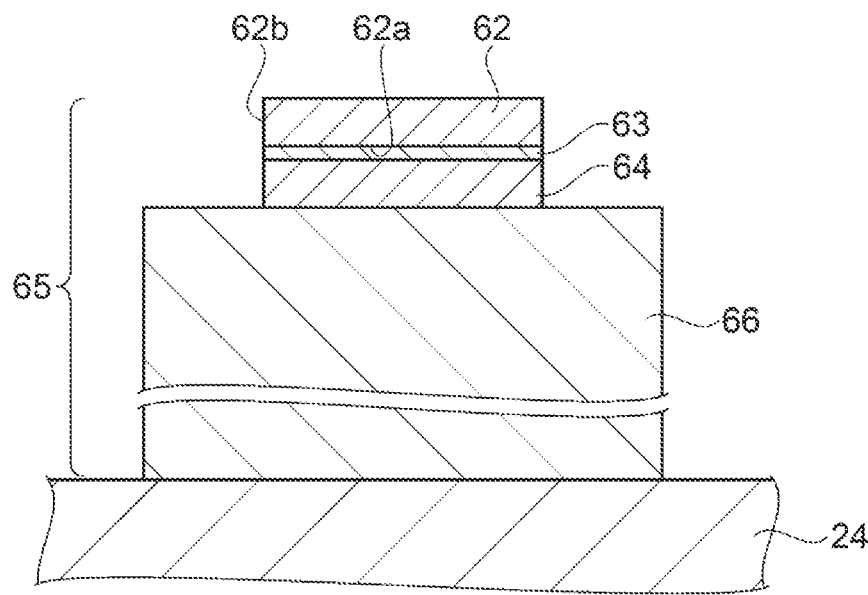
FIG. 6 is a schematic side cross-sectional view of a wavelength conversion member according to a comparative example.

A wavelength conversion member 65 according to a comparative example illustrated in FIG. 6 includes the phosphor 62 on a metal heat-dissipating holding unit 66 of the comparative example. The metal joining layer 63 is formed on the bottom surface 62a of the phosphor 62. The metal porous joining material 64 is provided between the metal joining layer 63 and the metal heat-dissipating holding unit 66 of the comparative example. The side surface 62b of the phosphor 62 is exposed to the air.

Figure 4:
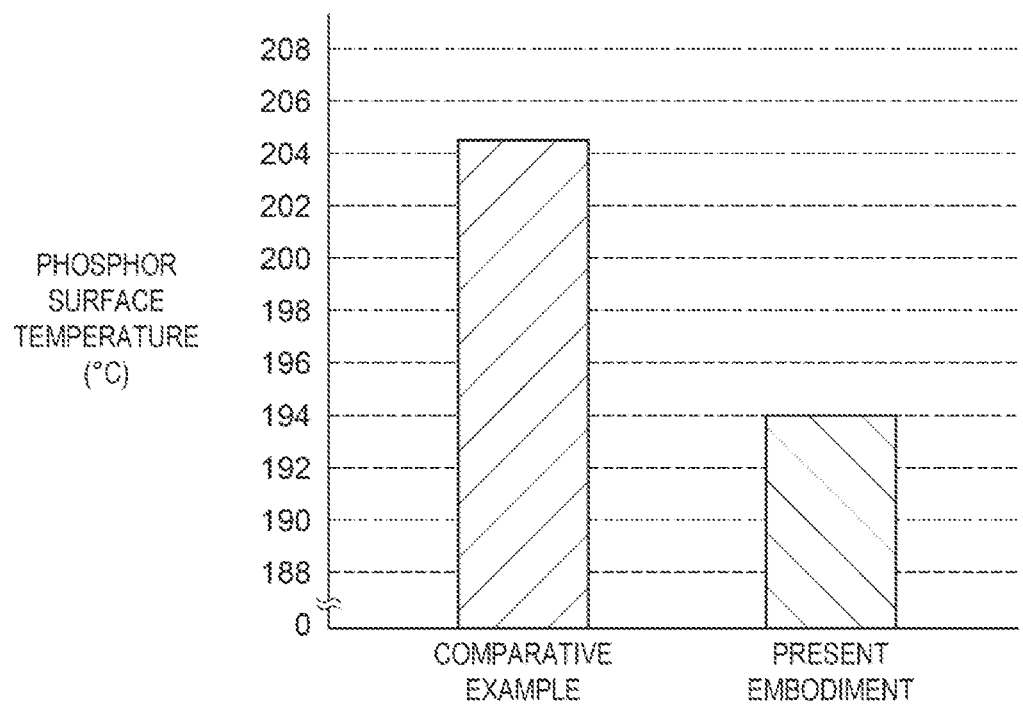
FIG. 4 is a chart for illustrating performance of a wavelength conversion device.

FIG. 4 illustrates the temperature of the phosphor 62 when a simulation was conducted in which the phosphor 62 of the wavelength conversion member 23 according to the present embodiment and the phosphor 62 of the wavelength conversion member 65 according to the comparative example are irradiated with a laser beam of 300 W. The conditions set in the simulation are as follows: the irradiation range of the laser beam is 2.45 mm in length, and 2.45 mm in width; the size of the phosphor 62 is 3.5 mm in length, 3.5 mm in width, and 120 μm in height; the thickness of the metal joining layer 63 is 0.3 μm; the thickness of the metal porous joining material 64 is 120 μm; the size of the metal heat-dissipating holding unit 61 and the metal heat-dissipating holding unit 66 of the comparative example is 8 mm in length, 8 mm in width, and 2 mm in thickness;

In the simulation model, a copper plate (not illustrated) is disposed between the metal heat-dissipating holding unit 61 and the heat sink 24, and between the metal heat-dissipating holding unit 66 of the wavelength conversion member 65 according to the comparative example and the heat sink 24, respectively. The size of the copper plate is 30 mm in length, 30 mm in width, and 3 mm in thickness. The heat sink 24 is an aluminum plate. The size of the aluminum plate is 60 mm in length, 60 mm in width, and 5 mm in thickness.

As illustrated in FIG. 4, the phosphor 62 of the wavelength conversion member 65 according to the comparative example reached 204.5° C. The phosphor 62 of the wavelength conversion member 23 according to the present embodiment reached 194.5° C. Accordingly, the structure of the wavelength conversion member 23 according to the present embodiment was able to reduce the temperature of the phosphor 62 by 10° C. compared to the comparative example.

The luminous efficiency of the wavelength conversion member 65 according to the comparative example was 44%. The luminous efficiency of the wavelength conversion member 23 according to the present embodiment was 46.75%. Accordingly, the structure of the wavelength conversion member 23 according to the present embodiment was able to improve the luminous efficiency of the phosphor 62 by 2.75% compared to the comparative example.

Second Embodiment

The present embodiment is different from the first embodiment in that the wavelength conversion member 23 is embedded in a member corresponding to the heat sink 24. Note that configurations identical to those in the first embodiment will be denoted by the same reference signs and redundant description thereof will be omitted.

Figure 5:
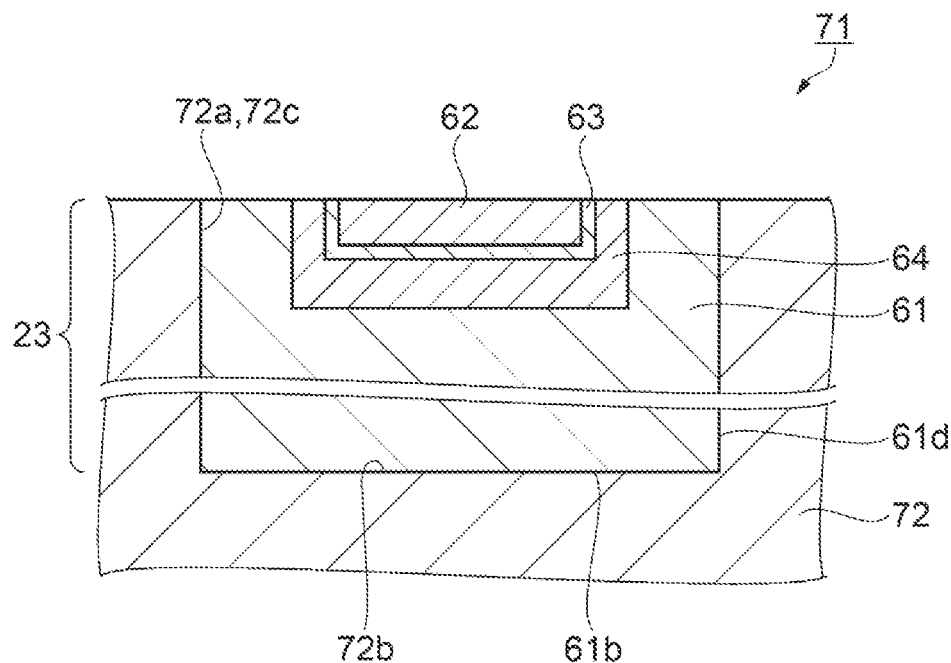
FIG. 5 is a schematic side cross-sectional view of a wavelength conversion device according to a second embodiment.

As illustrated in FIG. 5, a wavelength conversion device 71 includes a heat sink 72. The heat sink 72 corresponds to the heat sink 24 of the first embodiment. The heat sink 72 includes a recess 72a. The size of the recess 72a is substantially the same as that of the metal heat-dissipating holding unit 61. The metal heat-dissipating holding unit 61 is inserted into the recess 72a of the heat sink 72.

The back surface 61b of the metal heat-dissipating holding unit 61 is brought into contact with the bottom surface 72b of the recess 72a. A portion of the heat held by the metal heat-dissipating holding unit 61 is conducted from the back surface 61b of the metal heat-dissipating holding unit 61 through the bottom surface 72b of the recess 72a to the heat sink 72.

The side surface 61d of the metal heat-dissipating holding unit 61 is brought into contact with the side surface 72c of the recess 72a. A portion of the heat held by the metal heat-dissipating holding unit 61 is conducted from the side surface 61d of the metal heat-dissipating holding unit 61 through the side surface 72c of the recess 72a to the heat sink 72. Accordingly, the wavelength conversion device 71 can more efficiently conduct heat from the metal heat-dissipating holding unit 61 to the heat sink 72 than when only the back surface 61b of the metal heat-dissipating holding unit 61 is brought into contact with the heat sink 72. Paste having good thermal conductivity such as heat-dissipating silicon and nanodiamond grease may be disposed in the gap between the recess 72a of the heat sink 72 and the metal heat-dissipating holding unit 61. This allows heat to be further efficiently dissipated.

What is claimed is:
1. A wavelength conversion member comprising:
a phosphor;
a metal joining layer provided on a bottom surface and a side surface of the phosphor;
a metal heat-dissipating holding unit including a recess that covers the bottom surface and at least a portion of the side surface of the phosphor and that accommodates the phosphor so that the phosphor is embedded in the recess; and a metal porous joining material provided between the metal joining layer and the metal heat-dissipating holding unit, wherein the metal joining layer is metallically bonded with the metal porous joining material.

2. The wavelength conversion member according to claim 1, wherein the side surface is entirely covered with the metal porous joining material and the side surface is entirely embedded in the recess.

3. The wavelength conversion member according to claim 1, wherein a linear expansion coefficient of the metal heat-dissipating holding unit is $15 \times 10\text{-}6/°$ C. to $18 \times 10\text{-}6/°$ C. and a linear expansion coefficient of the metal joining layer is $14.7 \times 10\text{-}6/°$ C. to $24.7 \times 10\text{-}6/°$ C.

4. The wavelength conversion member according to claim 1, wherein a ratio of metal in unit volume of the metal porous joining material is not less than 60% and not greater than 70%.

5. A light-emitting device comprising the wavelength conversion member according to claim 1.

* * * * *